US009240322B2

(12) United States Patent
Jensen et al.

(10) Patent No.: US 9,240,322 B2
(45) Date of Patent: Jan. 19, 2016

(54) METHOD FOR FORMING SUPERACTIVE DEACTIVATION-RESISTANT JUNCTION WITH LASER ANNEAL AND MULTIPLE IMPLANTS

(75) Inventors: Jacob M. Jensen, Beaverton, OR (US); Harold W. Kennel, Portland, OR (US); Tahir Ghani, Portland, OR (US); Robert D. James, Portland, OR (US); Mark Y. Liu, West Linn, OR (US)

(73) Assignee: Intel Corporation, Santa Clara, CA (US)

( * ) Notice: Subject to any disclaimer, the term of this patent is extended or adjusted under 35 U.S.C. 154(b) by 79 days.

(21) Appl. No.: 13/995,171

(22) PCT Filed: Dec. 9, 2011

(86) PCT No.: PCT/US2011/064131
§ 371 (c)(1),
(2), (4) Date: Jun. 17, 2013

(87) PCT Pub. No.: WO2013/085536
PCT Pub. Date: Jun. 13, 2013

(65) Prior Publication Data
US 2013/0267084 A1 Oct. 10, 2013

(51) Int. Cl.
*H01L 21/425* (2006.01)
*H01L 21/268* (2006.01)
*H01L 29/78* (2006.01)
*H01L 21/265* (2006.01)

(52) U.S. Cl.
CPC .......... *H01L 21/2686* (2013.01); *H01L 21/268* (2013.01); *H01L 21/26506* (2013.01); *H01L 21/26513* (2013.01); *H01L 29/78* (2013.01)

(58) Field of Classification Search
CPC ................... H01L 21/26513; H01L 21/268
See application file for complete search history.

(56) References Cited

U.S. PATENT DOCUMENTS

| | | | | |
|---|---|---|---|---|
| 2007/0010073 A1* | 1/2007 | Chen et al. | ..................... | 438/486 |
| 2008/0023732 A1* | 1/2008 | Felch et al. | ................... | 257/288 |
| 2010/0151648 A1* | 6/2010 | Yu et al. | ....................... | 438/300 |

FOREIGN PATENT DOCUMENTS

WO 2013/085536 A1 6/2013

OTHER PUBLICATIONS

Koh, Alvin Tian-Yi et. al., Pulsed Laser Annealing of Silicon-Carbon Source/Drain in MuGFETs for Enhanced Dopant Activation an High Substitutional Carbon Concentration, IEEE Electron Device Letters, May 2008, vol. 29, No. 5, pp. 464-467.*

(Continued)

*Primary Examiner* — Zandra Smith
*Assistant Examiner* — Andre' C Stevenson
(74) *Attorney, Agent, or Firm* — Alpine Technology Law Group LLC

(57) ABSTRACT

A pulsed-laser anneal technique includes performing an implant of a selected region of a semiconductor wafer. A co-constituent implant of the selected region is performed, and the pulsed-laser anneal of the selected region performed. A pre-amorphizing implant of the selected region can also be performed. In one embodiment, the implant of the selected region is performed as an insitu implant. In another embodiment, the co-constituent implant is performed as an insitu non-donor implant. In yet another embodiment, the implant and the co-constituent implant of the selected region are performed as an insitu donor and co-constituent implant.

30 Claims, 5 Drawing Sheets

(56) References Cited

OTHER PUBLICATIONS

Liow, Tsung-Yang et al., Straned n-Channel FinFETs featuring In Situ Doped Silicon-Carbon (Si1-yCy) Source and Drain Stressors With High Carbon Content, IEEE Transactions on Electron Device, Sep. 2008, vol. 55, No. 9, pp. 2475-2483), hereinafter referred to as "LIOW".*

Wang et al., ("Performance enhancement schemes featuring lattice mismatched S/D stressors concurrently realized on CMOS platform e-SiGeSn S/Dfor pFETs by Sn+ implant and SiC S/D for nFets by C+ implant", 2008 symposium on VLSI Technology Papers).*

Koh, Alvin Tian-Yi et. al., Pulsed Laser Annealing of Silicon—Carbon Source/Drain in MuGFETs for Enhanced Dopant Activation an High Substitutional Carbon Concentration, IEEE Electron Device Letters, May 2008, vol. 29, No. 5, pp. 464-467.*

International Preliminary Report on Patentability and Written Opinion received for PCT Patent Application No. PCT/US2011/064131, mailed on Jun. 19, 2014, 11 pages.

Koh, et al., Pulsed Laser Annealing of Silicon—Carbon Source/Drain in MuGFETs for enchanced dopat Activation an High Substitutional carbon Concentratio, IEEE Electron Device Letters, vol. 29 No. 5, May 2008, pp. 464-467.

Liow, et al., "Strained n-Channel FinFETs Featuring In Situ Doped silicon-carbon (Si1-yCy) Source and Drain Stressors With High Carbon Content", IEEE Transactions on Electron Devices, vol. 55, No. 9, Sep. 2008, pp. 2475-2483.

International Search Report and Written opinion for PCT Patent Application No. PCT/US2011/064131, mailed on Aug. 30, 2012, 15 Pages.

Wang, et al., "Performance enhancement schemes featuring lattice mismatched S/D stressors concurrently realized on CMOS platform : e-SiGeS n SiD for pFETs by Sn+ implant and SiC S/D for nFETs by C+ implant", 2008 mymposium on VSLI Technology Digest of Technical Papers, Jun. 2008, pp. 207-208.

* cited by examiner

METHOD FOR FORMING SUPERACTIVE DEACTIVATION-RESISTANT JUNCTION WITH LASER ANNEAL AND MULTIPLE IMPLANTS

TECHNICAL FIELD

Embodiments described herein are generally directed to the field of semiconductor fabrication.

BACKGROUND

High dopant activation in source/drain or tip regions of a semiconductor device can significantly improve device performance, i.e., by reducing Rext. Pulsed-laser anneal processes can produce highly active "superactive" regions in a device by melt and rapid regrowth of the doped region. These regions, however, are susceptible to deactivation by subsequent thermal processes.

While pulsed-laser "melt" anneal processes for source-drain formation are not common in high-volume manufacturing, available literature generally describes a pulsed-laser "melt" anneal process as including pre-amorphizing implant in source/drain (such as a silicon implant), a source-drain implant (such as a phosphorous implant), followed by the pulsed-laser anneal process. The pulsed-laser anneal process is targeted to melt the amorphous material without melting the underlying substrate in which the boundaries of the source and drain are defined by the amorphizing implant conditions. The melt process produces super-activated regions having abrupt, box-like dopant profiles. Another common, closely related technique omits the pre-amorphizing implanting step and relies on fine control of the laser energy to control the depth of the super-active region. Depending on species and precise process parameters, raw activation levels of up to 100% can be achieved.

One key challenge in integrating such processes is retaining high activation levels through the remainder of the manufacturing process. Deactivation from subsequent thermal processes reduces net activation back towards equilibrium levels in the final product, thereby reducing the overall benefit of the melt-and-anneal process.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1A:
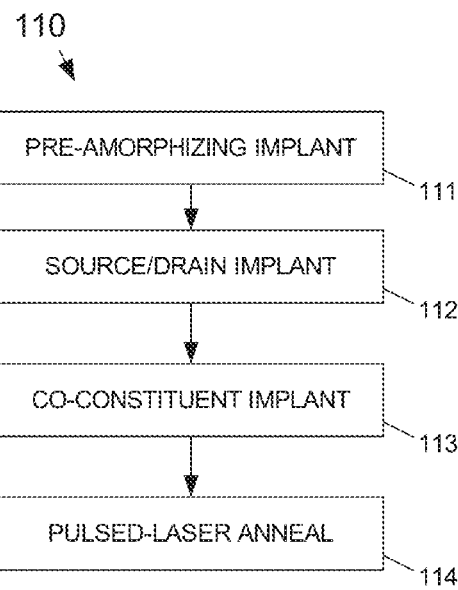
FIGS. 1A-1H respectively depict process flows for exemplary embodiments of a pulsed-laser anneal process according to the subject matter disclosed herein.

It will be appreciated that for simplicity and/or clarity of illustration, elements depicted in the figures have not necessarily been drawn to scale. For example, the dimensions of some of the elements may be exaggerated relative to other elements for clarity. The scaling of the figures does not represent precise dimensions and/or dimensional ratios of the various elements depicted herein. Further, if considered appropriate, reference numerals have been repeated among the figures to indicate corresponding and/or analogous elements.

DETAILED DESCRIPTION

Embodiments of techniques described herein relate to semiconductor fabrication and, more particularly, to fabricating superactive deactivation-resistant semiconductor junctions. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. Additionally, the word "exemplary" is used herein to mean "serving as an example, instance, or illustration." Any embodiment described herein as "exemplary" is not to be construed as necessarily preferred or advantageous over other embodiments.

Various operations may be described as multiple discrete operations in turn and in a manner that is most helpful in understanding the claimed subject matter. The order of description, however, should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The subject matter disclosed herein relates to semiconductor fabrication and; more particularly, to fabricating superactive deactivation-resistant semiconductor junctions.

The subject matter disclosed herein relates to a method to create a superactive junction that is resistant to deactivation from subsequent thermal processes.

The subject matter disclosed herein utilizes a liquid-phase redistribution of a multicomponent system that improves resilience against deactivation. An exemplary embodiment of the subject matter disclosed herein involves a pulsed-laser anneal process in which the melted region contains both the donor species and one or more co-constituents.

There are at least eight variations of the pulsed-laser anneal process disclosed herein, which are respectively depicted in FIGS. 1A-1H. For the following exemplary embodiments, any or all implant processes may refer to a conventional beam line ion implantation, an angled implantation or a conformal-plasma implantation to address issues associated with non-planar geometries. Additionally, one or more conventional annealing processes (e.g., furnace, RTP, or millisecond anneal) may be inserted into the flow. These particular anneals may serve purposes, such as defect reduction, partial regrowth, pre-activation, or dopant profile modification.

Because the subject matter disclosed herein is confined to a short and specific segment of an overall process flow, it expected that the techniques disclosed herein are be compatible with a wide variety of global process options. Implementation of the exemplary processes disclosed herein are be independent of the following parameters: (1) substrate type (e.g., compatible with BULK and SOI processes, and is independent of substrate orientation); (2) transistor architecture (e.g., compatible with planar and nonplanar architectures); (3) gate/gate oxide strategy (e.g. compatible with $SiO_2$/poly and both gate-first/gate-last high-k/MG processes); and (4) pulsed-laser anneal integration scheme (e.g., compatible with ARC, absorber strategies).

FIG. 1A is a flow diagram 110 depicting a first exemplary embodiment of a pulsed-laser anneal process according to the subject matter disclosed herein is an implant-only process. At 111 in FIG. 1A, a pre-amorphizing implant is performed. The order of the implants is not critical. At 112, a source/drain implant is performed. At 113, a co-constituent, such as carbon, is implanted. Other exemplary co-constituents include antimony (Sb), tin (Sn) and fluorine (F), and selection of a particular co-constituent to form a superactive region that is deactivation resistant depends on the particular active dopant species as well as the particular semiconductor. At 114, a pulsed-laser anneal process is performed.

Figure 1B:
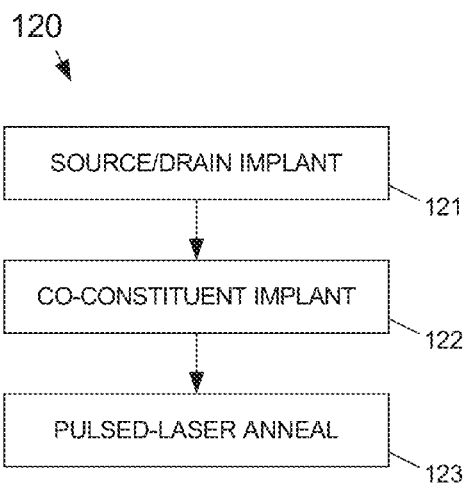

FIG. 1B is a flow diagram 120 depicting a second exemplary embodiment of a pulsed-laser anneal process according to the subject matter disclosed herein. The second exemplary embodiment is similar to the first exemplary embodiment, but omits the pre-amorphizing implant, in which case the boundaries of the melted region are defined by fine control of the laser energy applied during the pulsed-laser anneal process. At 121 in FIG. 1B, a source/drain implant is performed. At 122, a co-constituent, such as carbon, is implanted. At 123, a pulsed-laser anneal process is performed.

Figure 1C:
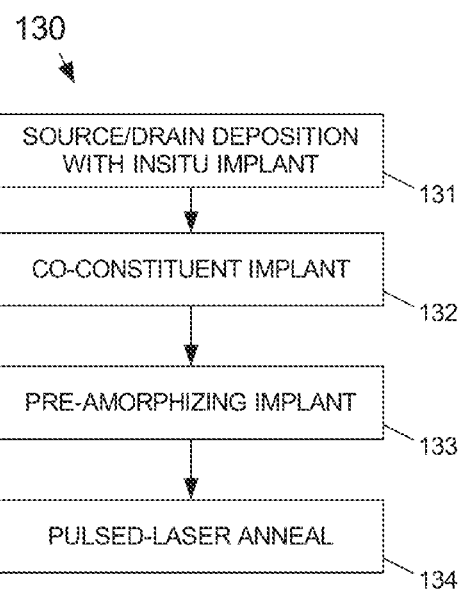

FIG. 1C is a flow diagram 130 depicting a third exemplary embodiment of a pulsed-laser anneal process according to the subject matter disclosed herein. The third exemplary embodiment utilizes an insitu-doped source-drain process in place of the source-drain implant process used in the first exemplary embodiment (FIG. 1A). In particular, at 131 in FIG. 1C, a chemical vapor deposition (CVD) source/drain deposition, for example, is performed with insitu source-drain doping. The order of the insitu implants is not critical for the third exemplary embodiment. At 132, a co-constituent, such as carbon, is implanted. At 133, a pre-amorphizing implant is performed. At 134, a pulsed-laser anneal process is performed.

Figure 1D:
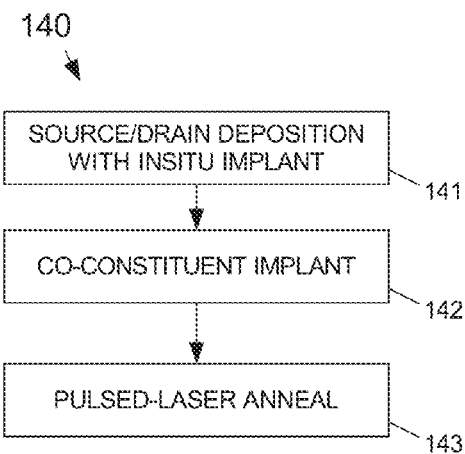

FIG. 1D is a flow diagram 140 depicting a fourth exemplary embodiment of a pulsed-laser anneal process according to the subject matter disclosed herein. The fourth exemplary embodiment is similar to the third exemplary embodiment, but omits the pre-amorphizing implant, in which case the boundaries of the melted region are defined by fine control of the laser energy applied during the pulsed-laser anneal process. At 141 in FIG. 1D, a chemical vapor deposition (CVD) source/drain deposition, for example, is performed with insitu source-drain doping. The order of the insitu implants is not critical for the fourth exemplary embodiment. At 142, a co-constituent, such as carbon, is implanted. At 143, a pulsed-laser anneal process is performed.

Figure 1E:
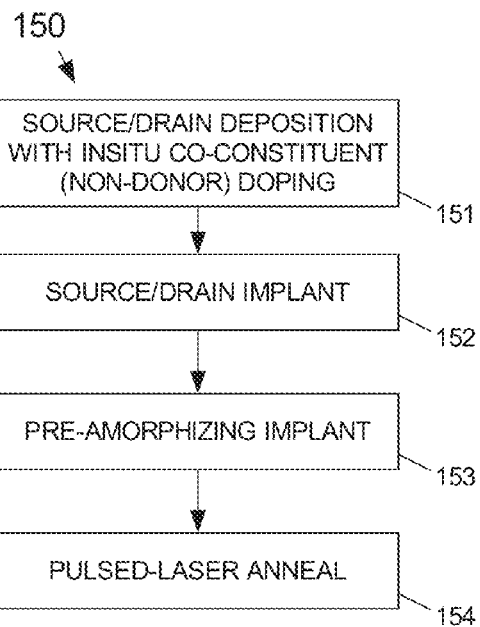

FIG. 1E is a flow diagram 150 depicting a fifth exemplary embodiment of a pulsed-laser anneal process according to the subject matter disclosed herein. The fifth exemplary embodiment utilizes an insitu-doped source-drain process in place of the source-drain implant process that is used in the third exemplary embodiment (FIG. 1C). At 151 in FIG. 1E, a chemical vapor deposition (CVD) source/drain deposition, for example, is performed with insitu (non-donor) source-drain doping. The order of the insitu implants is not critical for the fifth exemplary embodiment. At 152, a source/drain implant is performed. At 153, a pre-amorphizing implant is performed. At 154, a pulsed-laser anneal process is performed.

Figure 1F:
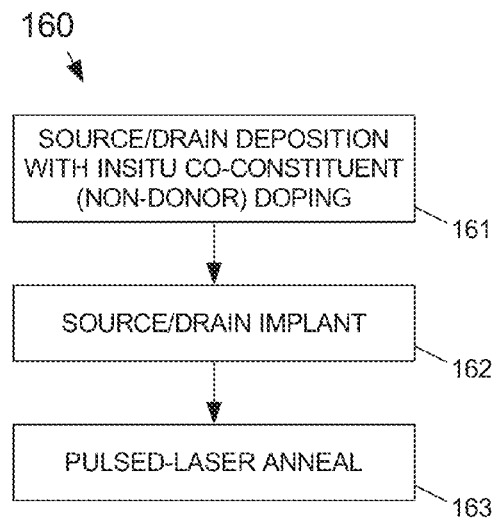

FIG. 1F is a flow diagram 160 depicting a sixth exemplary embodiment of a pulsed-laser anneal process according to the subject matter disclosed herein. The sixth exemplary embodiment is similar to the fifth exemplary embodiment, but omits the pre-amorphizing implant, in which case the boundaries of the melted region are defined by fine control of the laser energy applied during the pulsed-laser anneal process. At 161, a chemical vapor deposition (CVD) source/drain deposition, for example, is performed with insitu (non-donor) source-drain doping. The order of the insitu implants is not critical for the sixth exemplary embodiment. At 162, a source/drain implant is performed. At 163, a pulsed-laser anneal process is performed.

Figure 1G:
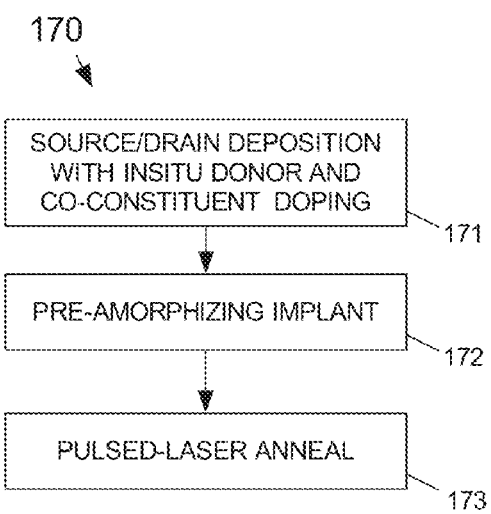

FIG. 1G is a flow diagram 170 depicting a seventh exemplary embodiment of a pulsed-laser anneal process according to the subject matter disclosed herein. The seventh exemplary embodiment is similar to the third exemplary embodiment (FIG. 1C), but differs by having all implants replaced by insitu doping. At 171, a chemical vapor deposition (CVD) source/drain deposition, for example, is performed with insitu implant of donor and co-constituent source-drain doping. The order of the insitu implants is not critical for the seventh exemplary embodiment. At 172, a pre-amorphizing implant is performed. It should be understood that in an alternative exemplary embodiment, the pre-amorphizing implant could be performed prior to the insitu implant of donor and co-constituent source-drain doping. At 173, a pulsed-laser anneal process is performed.

Figure 1H:
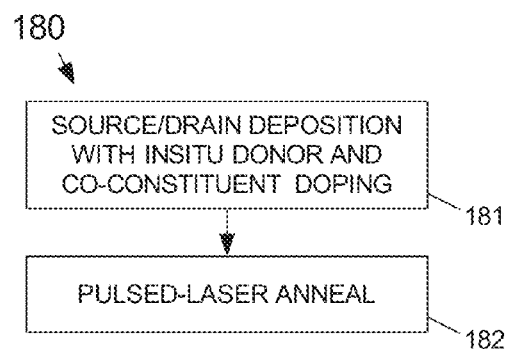

FIG. 1H is a flow diagram 180 depicting an eighth exemplary embodiment of a pulsed-laser anneal process according to the subject matter disclosed herein. The eighth exemplary embodiment is similar to the seventh exemplary embodiment (FIG. 1G), but omits the pre-amorphizing implant, in which case the boundaries of the melted region are defined by fine control of the laser energy applied during the pulsed-laser anneal process. At 181, a chemical vapor deposition (CVD) source/drain deposition, for example, is performed with insitu of donor and co-constituent source-drain doping. The order of the insitu implants is not critical for the eighth exemplary embodiment. At 182, a pulsed-laser anneal process is performed. The effectiveness of the subject matter disclosed herein has been demonstrated on As-implanted blanket wafers with and without carbon as a co-constituent. The process flow for the As-only system included deep p-well implants and activation followed by a 12 keV $7\times10^{14}$ silicon pre-amorphizing implant, and a 10 keV $4.8\times10^{15}$ As implant. Process flow for the As—C system was the same and carbon was added by two successive implants at 4 keV 2 keV to achieve ~1% total C concentration.

Figure 2A:
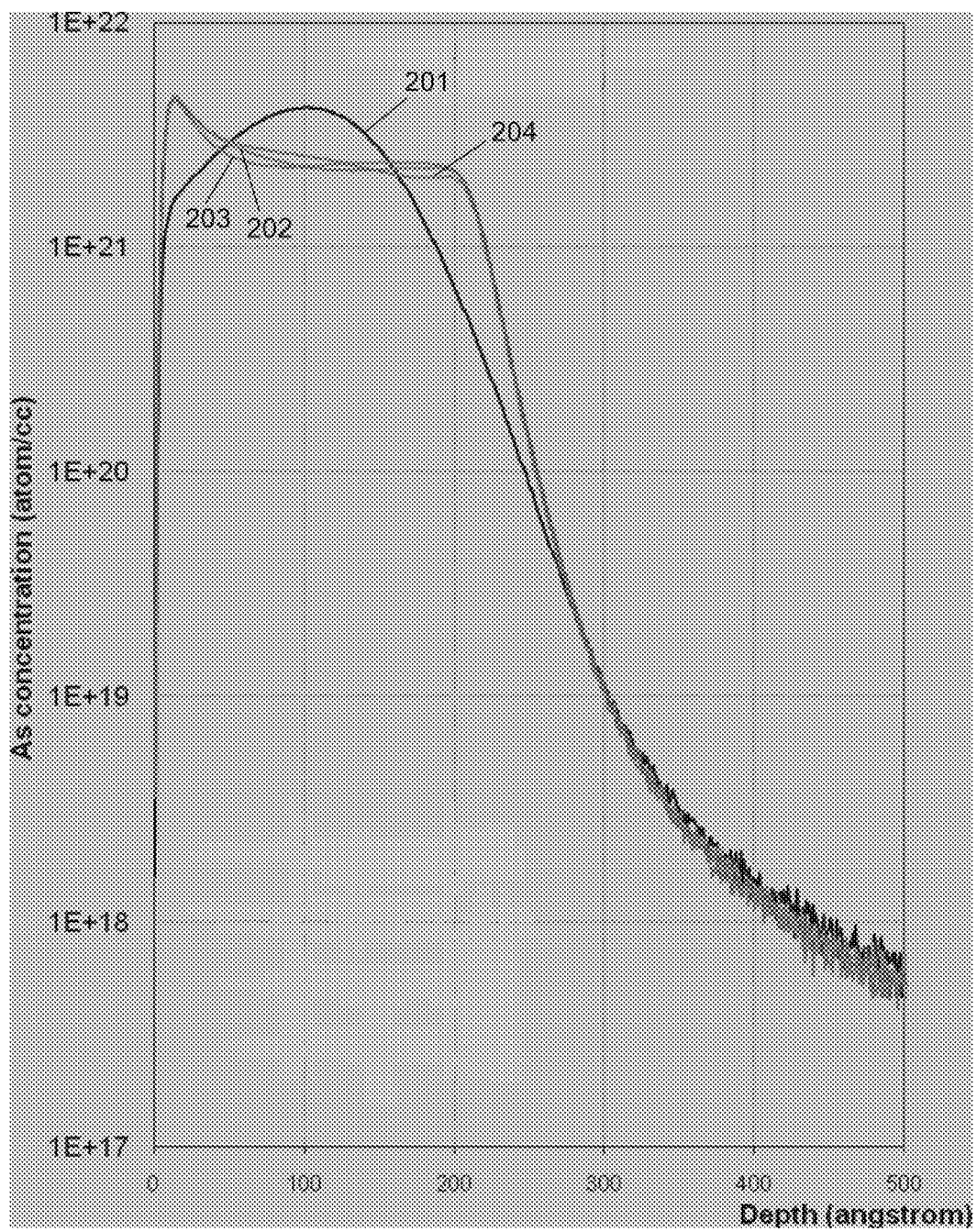
FIG. 2A is a graph showing exemplary liquid-phase SIMS redistribution data for arsenic (As) concentration for an As-only system as a function of depth for different four laser anneal conditions.
Figure 2B:
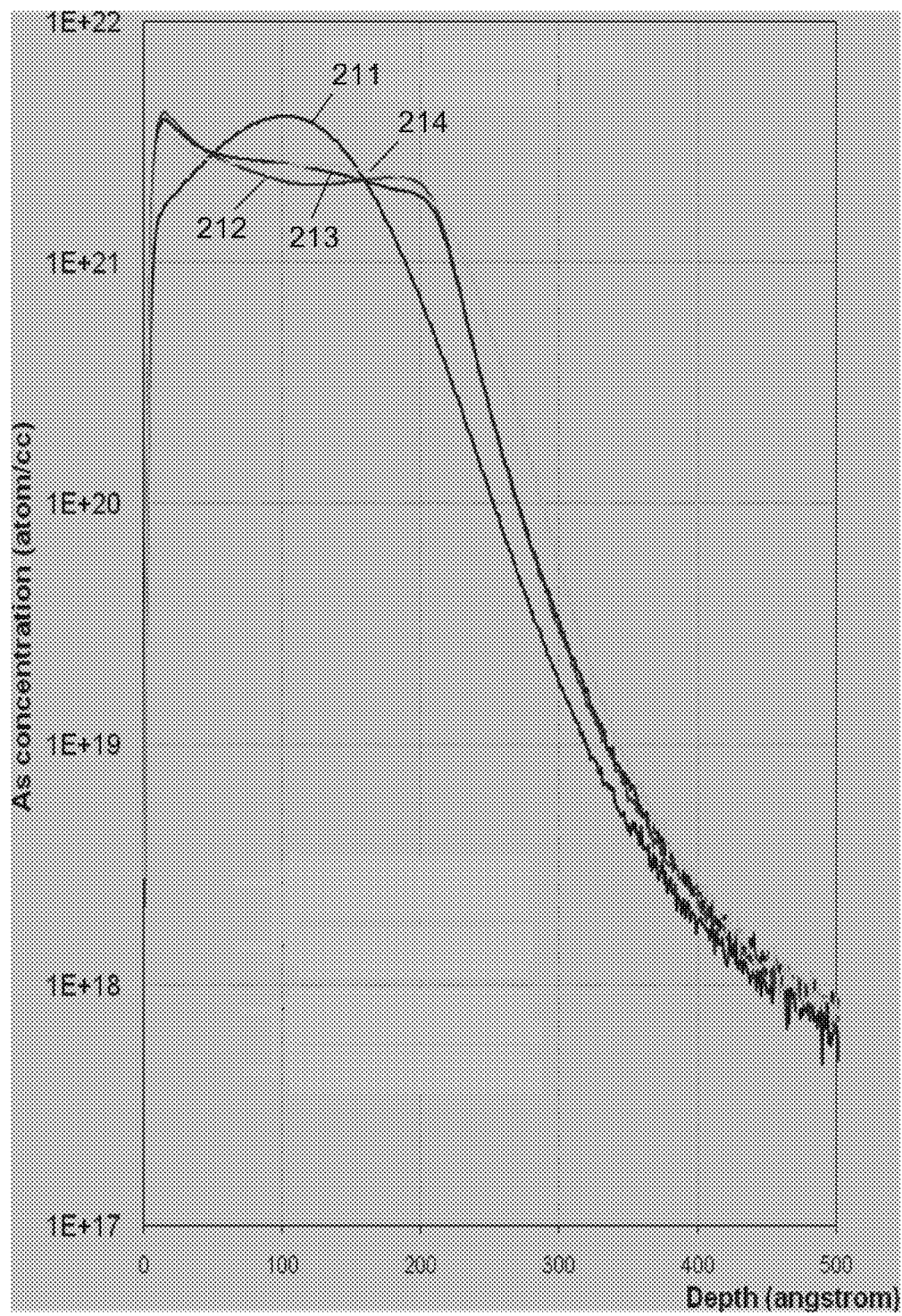
FIG. 2B is a graph showing exemplary liquid-phase SIMS redistribution data for arsenic (As) concentration for an As—C system as a function of depth for different four laser anneal conditions.

FIG. 2A is a graph showing exemplary liquid-phase SIMS redistribution data for arsenic (As) concentration for the As-only system as a function of depth for different four laser anneal conditions. The ordinate of FIG. 2A is As concentration measured as As atoms/$cm^3$, and the abscissa of FIG. 2A is depth in Ångstroms. The four laser anneal conditions are (1) no anneal shown at 201, pulsed-laser anneal using 500 mJ/$cm^2$ shown at 202; pulsed-laser anneal using 550 mJ/$cm^2$ shown at 203; and pulsed-laser anneal using 600 ml/$cm^2$ shown at 204. FIG. 2B is a graph showing exemplary liquid-phase SIMS redistribution data for arsenic (As) concentration for the As—C system as a function of depth for different four laser anneal conditions. The ordinate of FIG. 2B is As concentration measured as As atoms/cm$^3$, and the abscissa of FIG. 2B is depth in Ångstroms. The four laser anneal conditions are no anneal shown at 211, pulsed-laser anneal using 500 mJ/cm$^2$ shown at 212; pulsed-laser anneal using 550 mJ/cm$^2$ shown at 213; and pulsed-laser anneal using 600 mJ/cm$^2$ shown at 214.

Figure 3:
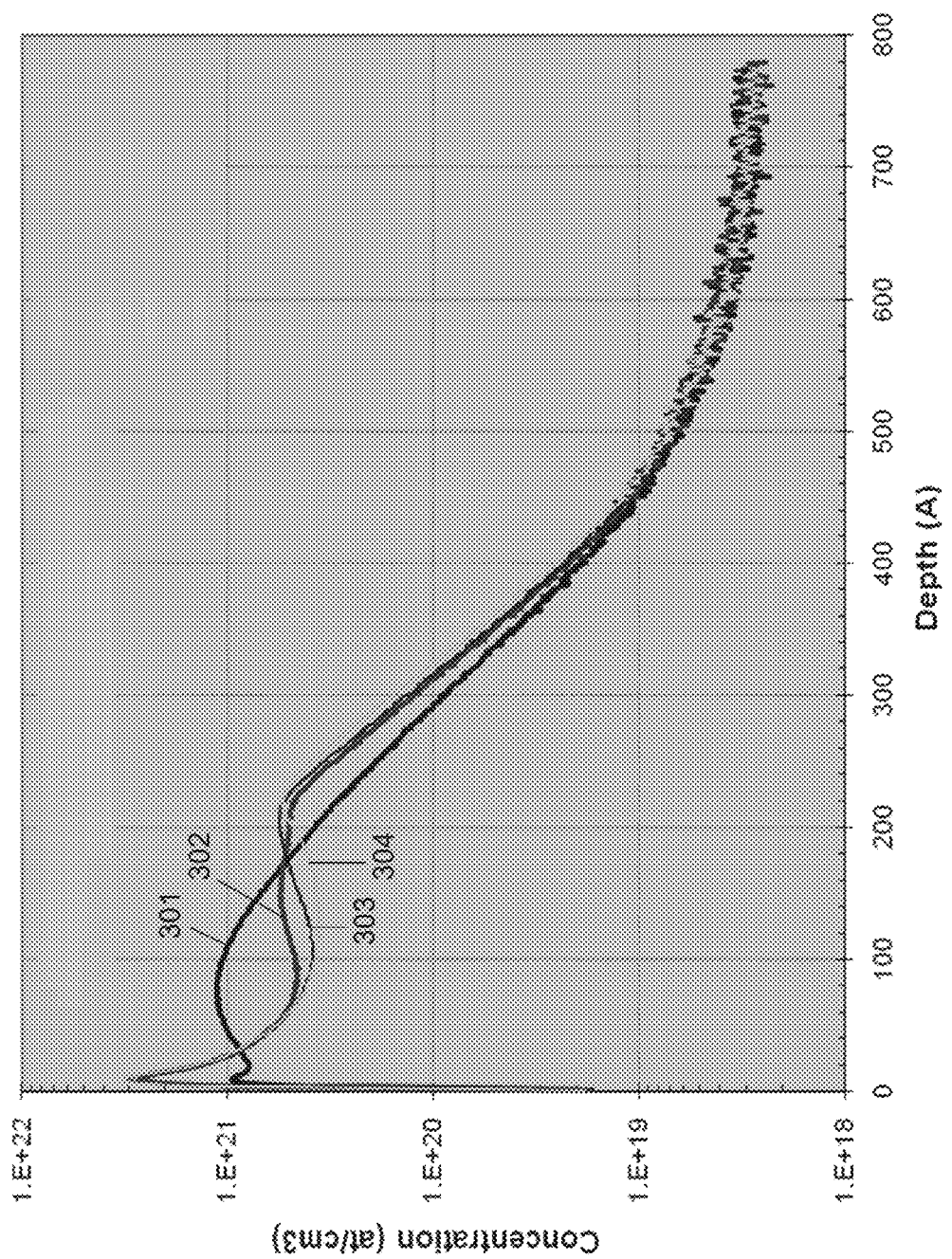
FIG. 3 is a graph showing exemplary liquid-phase SIMS redistribution data for carbon concentration for the As—C system as a function of depth for four different laser anneal conditions.

FIG. 3 is a graph showing exemplary liquid-phase SIMS redistribution data for carbon (C) concentration for the A-C system as a function of depth for four different laser anneal conditions. The ordinate of FIG. 3 is As concentration measured as C atoms/cm$^3$, and the abscissa of FIG. 3 is depth in Ångstroms. Again, the four laser anneal conditions are no anneal shown at 301, pulsed-laser anneal using 500 mJ/cm$^2$ shown at 302; pulsed-laser anneal using 550 mJ/cm$^2$ shown at 303; and pulsed-laser anneal 600 mJ/cm$^2$ shown at 304.

Table 1 shows the sheet resistance (Rs) and absolute active-carrier concentration after pulsed-laser anneal and a series of subsequent deactivating anneals (i.e., 700 C spike anneal plus 300 C one-hour furnace anneal).

TABLE 1

| | Rs ($\Omega$/cm$^2$) | [Active Carrier]/cm$^2$ | Enhancement |
|---|---|---|---|
| As | 223.38 | $2.17 \times 10^{20}$ | N/A |
| As + C | 194.55 | $2.93 \times 10^{20}$ | 35% |

Both the As-only system and the As+C system have a concentration of As of approximately $1.6 \times 10^{21}$ atoms/cm$^3$ and junction depth Xj (i.e., the depth at which the concentration of As drops below $1 \times 10^{19}$ atoms/cm$^3$) of approximately 30 nm. After annealing, the liquid-phase redistribution of As+C system according to the subject matter disclosed herein exhibits activation enhanced of about 35% over the As-only system.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. A method, comprising:
    performing an implant of a selected region of a semiconductor wafer;
    performing a co-constituent implant of the selected region of the semiconductor wafer; and
    performing a pulsed-laser anneal of the selected region to superactivate the selected region by melting and rapid regrowing of the selected region, wherein the selected region contains both a donor species and a co-constituent to protect the superactivated selected region from subsequent deactivation after the pulsed-laser anneal is performed and wherein the pulsed-laser anneal is performed at a power level that measures between 500 milliJoules per square centimeter (mJ/cm$^2$) and 600 milliJoules per square centimeter (mJ/cm$^2$).

2. The method according to claim 1, wherein the pulsed-laser anneal is performed at a power level that measures 550 milliJoules per square centimeter (mJ/cm$^2$).

3. The method according to claim 1, wherein the selected region comprises a concentration of arsenic of approximately $1.6 \times 10^{21}$ atoms per square centimeter and a junction depth of approximately 30 nanometers.

4. The method according to claim 2, wherein performing the pre-amorphizing implant is performed after performing the implant of the selected region of semiconductor wafer, and after the performing the co-constituent implant of the selected region of the semiconductor wafer.

5. The method according to claim 1, wherein performing implant of a selected region of the semiconductor wafer is performed as an insitu implant.

6. The method according to claim 5, further comprising performing a pre-amorphizing implant of the selected region of the semiconductor wafer.

7. The method according to claim 6, wherein performing the pre-amorphizing implant is performed prior to performing the implant of the selected region of semiconductor wafer, and prior to the performing the co-constituent implant of the selected region of the semiconductor wafer.

8. The method according to claim 6, wherein performing the pre-amorphizing implant is performed after performing the implant of the selected region of the semiconductor wafer, and after the performing the co-constituent implant of the selected region of the semiconductor wafer.

9. The method according to claim 1, wherein performing the co-constituent implant of the selected region of the semiconductor wafer is performed as an insitu non-donor implant.

10. The method according to claim 9, further comprising performing a pre-amorphizing implant of the selected region of the semiconductor wafer.

11. The method according to claim 10, wherein performing the pre-amorphizing implant is performed prior to performing the implant of the selected region of the semiconductor wafer, and prior to the performing the co-constituent implant of the selected region of the semiconductor wafer.

12. The method according to claim 10, wherein performing the pre-amorphizing implant is performed after performing the implant of the selected region of the semiconductor wafer, and after the performing the co-constituent implant of the selected region of the semiconductor wafer.

13. The method according to claim 1, wherein performing the implant of the selected region of the semiconductor wafer and performing the co-constituent implant of the selected region of the semiconductor wafer are performed as an insitu donor and co-constituent implant.

14. The method according to claim 13, further comprising performing a pre-amorphizing implant of the selected region of the semiconductor wafer.

15. The method according to claim 14, wherein performing the pre-amorphizing implant is performed prior to performing the insitu donor and co-constituent implant.

16. The method according to claim 14, wherein performing the pre-amorphizing implant is performed after performing the insitu donor and co-constituent implant.

17. The method according to claim 1, wherein the selected region comprises a source or a drain of a semiconductor device.

18. A method, comprising:
    performing an implant of a selected region of a semiconductor wafer, the selected region comprising a source or a drain of a semiconductor device;
    performing a co-constituent implant of the selected region of the semiconductor wafer; and
    performing a pulsed-laser anneal of the selected region to superactivate the selected region by melting and rapid regrowing of the selected region, wherein the selected region contains both a donor species and a co-constituent to protect the superactivated selected region from subsequent deactivation after the pulsed-laser anneal is performed and wherein the pulsed-laser anneal is performed at a power level that measures between 500 milliJoules per square centimeter (mJ/cm$^2$) and 600 milliJoules per square centimeter (mJ/cm$^2$).

19. The method according to claim 18, wherein the pulsed-laser anneal is performed at a power level that measures 550 milliJoules per square centimeter (mJ/cm$^2$).

20. The method according to claim 18, wherein the selected region comprises a concentration of arsenic of approximately $1.6 \times 10^{21}$ atoms per square centimeter and a junction depth of approximately 30 nanometers.

21. The method according to claim 20, further comprising performing a pre-amorphizing implant of the selected region of the semiconductor wafer.

22. The method according to claim 18, wherein performing the co-constituent implant of the selected region of the semiconductor wafer is performed as an insitu non-donor implant.

23. The method according to claim 22, further comprising performing a pre-amorphizing implant of the selected region of the semiconductor wafer.

24. The method according to claim 18, wherein performing the implant of the selected region of the semiconductor wafer and performing the co-constituent implant of the selected region of the semiconductor wafer are performed as an insitu donor and co-constituent implant.

25. The method according to claim 24, further comprising performing a pre-amorphizing implant of the selected region of the semiconductor wafer.

26. A method, comprising:
performing an implant of a selected region of a semiconductor wafer;
performing a co-constituent implant of the selected region of the semiconductor wafer;
performing a pre-amorphizing implant of the selected region of the semiconductor wafer; and
performing a pulsed-laser anneal of the selected region to superactivate the selected region by melting and rapid regrowing of the selected region, wherein the selected region contains both a donor species and a co-constituent to protect the superactivated selected region from subsequent deactivation after the pulsed-laser anneal is performed and wherein the pulsed-laser anneal is performed at a power level that measures between 500 milliJoules per square centimeter (mJ/cm$^2$) and 600 milliJoules per square centimeter (mJ/cm$^2$).

27. The method according to claim 26, wherein the pulsed-laser anneal is performed at a power level that measures 550 milliJoules per square centimeter (mJ/cm$^2$).

28. The method according to claim 26, wherein the selected region comprises a concentration of arsenic of approximately $1.6 \times 10^{21}$ atoms per square centimeter and a junction depth of approximately 30 nanometers.

29. The method according to claim 26, wherein performing the implant of a selected region of semiconductor wafer and performing the co-constituent implant of the selected region of the semiconductor wafer are performed as an insitu donor and co-constituent implant.

30. The method according to claim 26, further comprising performing a pre-amorphizing implant of the selected region of the semiconductor wafer.

* * * * *